United States Patent [19]

Scifres et al.

[11] Patent Number: 4,603,421
[45] Date of Patent: Jul. 29, 1986

[54] INCOHERENT COMPOSITE MULTI-EMITTER LASER FOR AN OPTICAL ARRANGEMENT

[75] Inventors: Donald R. Scifres, Los Altos; Eric G. Rawson, Saratoga, both of Calif.

[73] Assignee: Xerox Corporation, Stamford, Conn.

[21] Appl. No.: 444,145

[22] Filed: Nov. 24, 1982

[51] Int. Cl.$^4$ ................................. H01S 3/19
[52] U.S. Cl. .................... 372/50; 350/96.16; 372/46; 372/48
[58] Field of Search ............ 372/50, 45, 46, 96, 372/48; 357/17; 350/96.16, 96.15, 96.12

[56] References Cited

U.S. PATENT DOCUMENTS 4,318,058  3/1982  Mito et al. ........................ 372/50

OTHER PUBLICATIONS

Rawson et al, "Speckle in Optical Fibers" *SPIE* vol. 243 *Applications of Speckle Phenomena*, 1980, pp. 28–34.
Rawson, "Application of Fiber Optics to Local Networks" Proceedings of the LACN Symposium, May 1979, pp. 155–167.
Scifres et al, "High Power Coupled Multiple Stripe Quantum Well Injection Lasers", Appl. Phys. Lett. 41(2) 15 Jul. 1982, pp. 118–120.
Aiki et al, "A Frequency-Multiplexing Light Source with Monolithically Integrated Lasers", IEEE JQE vol. QE-13, No. 4, Apt. 1977, pp. 220–223.

*Primary Examiner*—James W. Davie

[57] ABSTRACT

A multi-emitter extended source solid state laser designed to omit light beams at multiple wavelengths within a narrow total spectral bandwidth, that is, a relatively incoherent composite output beam of narrow total spectral bandwidth, is used as the input to a multimode optical fiber of an optic communications link or network. By providing an incoherent composite laser input beam to the fiber, modal noise due to coherence effects are virtually eliminated so that such effects no longer affect network performance. In addition, because the source is extended, a more uniform illumination of the fiber face is achieved. An exemplary multi-emitter laser would consist of an array of simultaneously driven emitting regions or cavities which operate in multiple longitudinal modes.

2 Claims, 15 Drawing Figures

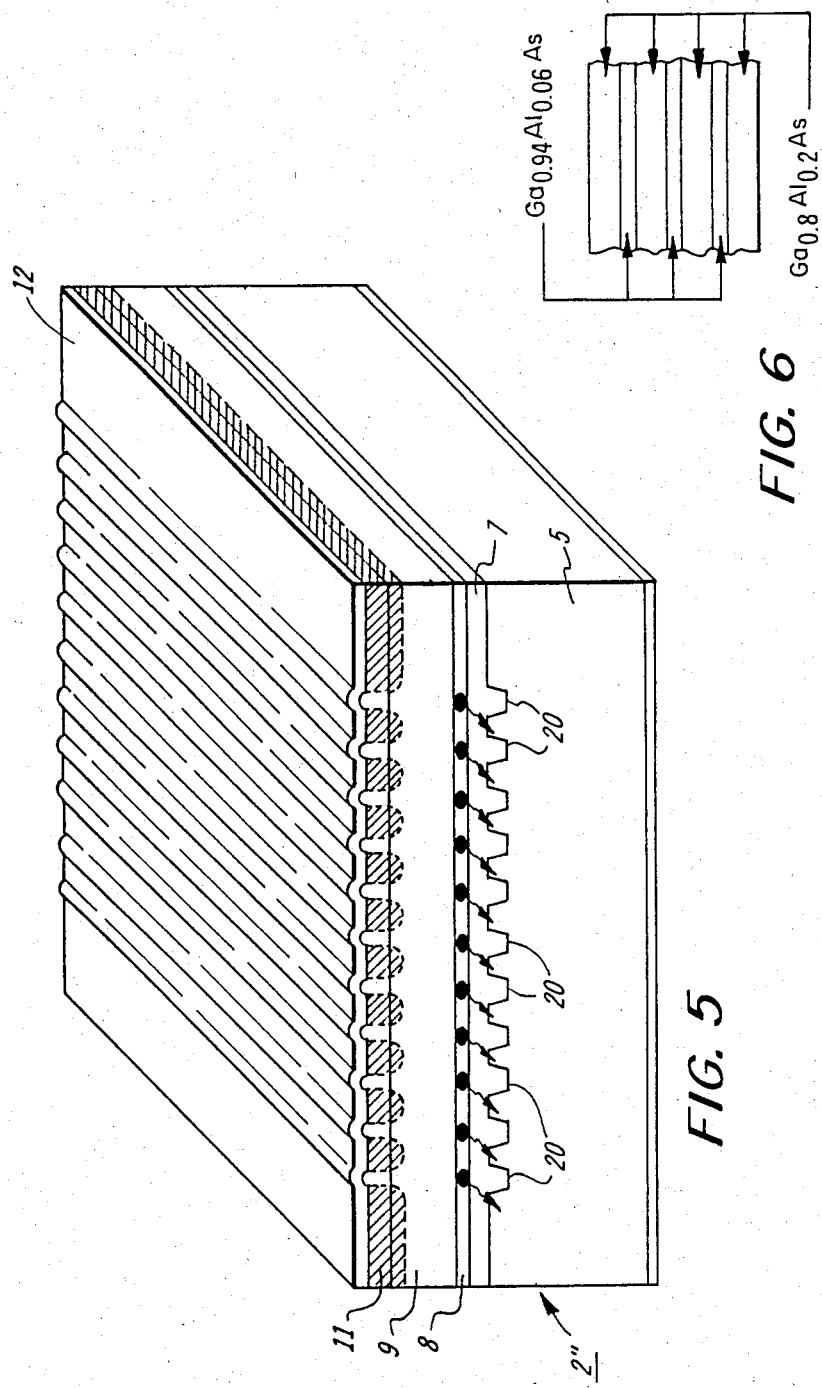

INCOHERENT COMPOSITE MULTI-EMITTER LASER FOR AN OPTICAL ARRANGEMENT

BACKGROUND OF THE INVENTION

The advantages of using fiber optic communications networks include immunity to electro-magnetic interference, freedom from ground current loops, enhanced security and potential cost savings. The most common types of fibers used today in such networks have either a homogeneous stepped-index core and a cladding with significantly lower refractive index than the core so that some of the light in the core is reflected back into the core by a lossless process called total internal reflection or a gradient index core which similarly guides light by continuous refraction. In a single mode fiber, the core diameter and the core-to-cladding refractive index difference are kept sufficiently small so that only the lowest order mode is guided. In the multimode stepped index fiber, because the core diameter is larger and the refractive index difference is larger, many modes are guided. Graded index fibers are multimode fibers with a core whose refractive index decreases almost parabolically with radius.

Laser diodes are often coupled to multimode optical fibers for data transmission purposes. Such laser diodes emit from a single spot or point source which is $\sim 1$ $\mu$m high by $\sim 2$–$8$ $\mu$m wide. The core region of a multimode optical fiber is generally 50–500 $\mu$m in diameter. Light from the laser is generally launched into the fiber by positioning the small laser spot in the center of the core of the fiber and positioning the emitting region of the laser very close to the end of the fiber. With this coupling method, a uniform distribution of light in all spatial modes of the multimode fiber occurs only after the light has traveled a considerable distance in the optical fiber. If light in the fiber is split in a STAR coupler, a non-uniform light distribution in the fiber will result in a non-uniform light distribution in the output fibers of the STAR coupler. Thus it is important to distribute the light as uniformly as possible at the fiber input.

Modal noise is the name given to an undesired modulation of the light intensity emerging from a multimode optical fiber. Basically, such noise is caused by the interference of the light with itself in a time-varying manner. Under certain conditions (high source coherence plus either fiber motion, temperature changes, or source wavelength charge), a speckled intensity pattern which changes with time exists at the fiber output plane. If in addition some form of mode-selective attenuation is present modal noise is high when a highly coherent light source, such as a single longitudinal mode semiconductor laser, is used as the input to the fiber since, due to the long coherence length of the light output of a single longitudinal mode laser, the light can propagate a long distance through the fiber and still interfere with itself. More specifically, it is known that there exists a critical frequency difference, $\Delta\nu_C$, which is a function of the total amount of modal dispersion in the fiber link. When multiple source frequencies differ from one another by less than $\Delta\nu_C$, they will all interfere with one another at the fiber output plane, creating a speckle pattern of high contrast, and thus creating the opportunity for modal noise. When there are N optical sources, all of which differ from one another by more than $\Delta\nu_C$, interference is eliminated and the N independent speckle patterns sum intensity-wise, reducing the speckle pattern's contrast to $1/\sqrt{N}$. Contrast reduction implies modal noise reduction. Thus it is clear that a large number of source frequencies, all separated by more than $\Delta\nu_C$, is desired to minimize modal noise.

An ideal light source for a multimode fiber from the reduction of modal noise standpoint and from the standpoint of uniformly illuminating a fiber is a light-emitting diode (LED). Since modal noise is related to coherence length and an LED is an incoherent emitter, modal noise is eliminated. Additionally, an LED is an extended spatial source which more uniformly illuminates most of the modes of the fiber. However, an LED cannot be modulated as rapidly as a laser, nor can it inject as much optical power as can a laser, an important consideration when power splitters are to be used. In addition, because of its broad emission spectra, fiber wavelength dispersion limits the system bandwidth to undesirably low data rates.

SUMMARY OF THE INVENTION

In accordance with the present invention, a multi-emitter extended source solid state laser designed to emit light beams at multiple wavelengths within a narrow total spectral bandwidth, that is, a relatively incoherent composite output beam of narrow total spectral bandwidth, is used as the input to a multimode optical fiber of an optic communications link or network. By providing an incoherent composite laser input beam to the fiber, modal noise due to coherence effects are virtually eliminated so that such effects no longer affect network performance. In addition, because the source is extended (that is, not a point source), a more uniform illumination of the fiber face is achieved. An exemplary multi-emitter laser would consist of an array of simultaneously driven emitting regions or cavities which operate in multiple longitudinal modes.

Such a laser may consist of multiple gain-guided lasing regions spaced along the plane of the p-n junction. Since there is no real refractive index waveguiding, multiple longitudinal mode operation occurs. These multiple longitudinal modes are not coherent with each other, although in one specific case the spatial modes of all lasing regions may be coherent. (This case is called a phase-locked laser.) Because these longitudinal modes are not coherent with each other, they do not interfere and thus, from a modal noise standpoint, such a gain-guided multi-emitter laser has the same advantages as an LED. Furthermore, since a multi-emitter laser can be made of a width approximately matching the core diameter of the optical fiber, a more uniform spatial distribution of the light in the fiber (that is, excitation of a larger fraction of the total number of guided modes) can be achieved relative to a single emitter laser. Thus, in these two features, the multiemitter laser approximates the advantages of an LED while outperforming an LED in other aspects, as previously mentioned.

A further improved exemplary multi-emitter laser would consist of an array of simultaneously driven emitting regions or cavities which are sufficiently spaced apart that optical coupling does not occur to a great extent. Because the emitting regions are not highly coupled, they act as at least partially independent optical cavities. Thus, in this case, both gain-guided lasers (which normally exhibit multiple longitudinal mode operation) and index-guided lasers (which normally exhibit single longitudinal mode operation) produce longitudinal modes which are not coherent with longitudinal modes from another portion of the emitting region. That is, the emission from such lasers is neither temporally nor spatially coherent. These lasers, therefore, comprise an incoherent extended source which is even less coherent than the aforementioned gain-guided phase-locked laser source since there is little or no spatial or temporal coherence of emission. Thus, from a modal noise and alignment sensitivity standpoint, this type of source clearly approximates an LED. However, since the light source is a laser, its beam is more directional and can be coupled more efficiently into the fiber. Also, it can be rapidly modulated and thus have a high data rate. Because the multi-emitter laser emits at wavelengths which can be made to be only slightly separated from each other, a large number of incoherent laser wavelengths can be made to lie at approximately the same center wavelength while having a narrow total spectral bandwidth. This is especially true of index-guided lasers. Such an emitter would greatly reduce the system bandwidth limitation due to spectral dispersion in a multimode fiber relative to a LED source.

BRIEF DESCRIPTION OF THE DRAWINGS

FIGS. 4, 4a, 5 and 6 show specific forms of the laser of FIGS. 1–3.

FIG. 13 shows the pulsed response of the laser of FIGS. 4 and 4a.

FIG. 14 shows the longitudinal mode spectrum of the laser of FIGS. 4 and 4a.

DETAILED DESCRIPTION OF THE INVENTION

Figure 1:
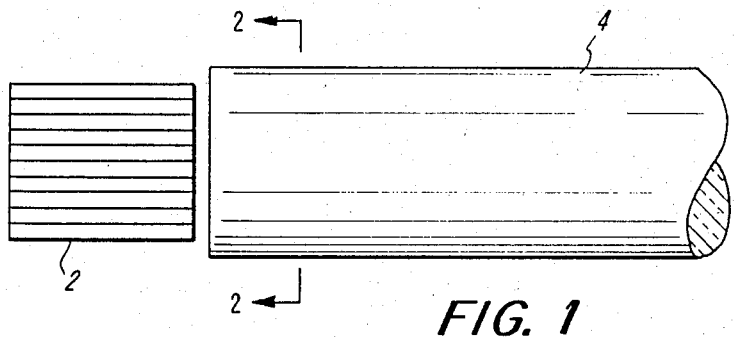
FIG. 1 is a multi-emitter extended source solid state laser as the input to a multimode optical fiber.
Figure 2:
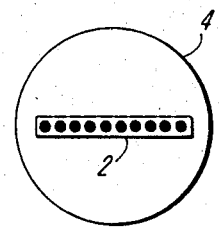
FIG. 2 shows a cross-section through the fiber of FIG. 1 taken along line 2—2.

Referring first to FIGS. 1 and 2, a multi-emitter solid state laser 2 which emits an incoherent composite output beam is butt coupled to a cleaved end of a multimode optical fiber 4. Fiber 4 can be any conventional multimode optical fiber of either the stepped index type or the graded index type. Specifically, fiber 4 can be a Corning Fat Fiber having a quasi-stepped index profile, a core diameter of 100 microns and a numerical aperture of 0.3.

Figure 3:
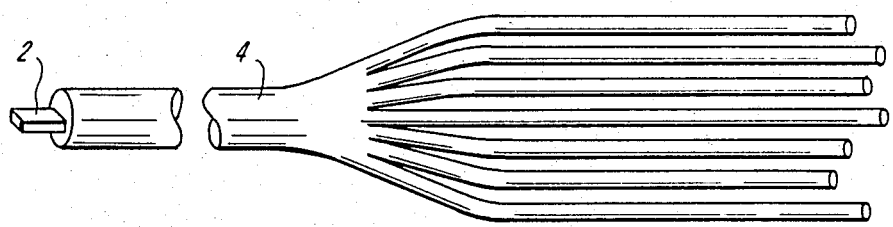
FIG. 3 shows a multi-emitter extended source solid state laser as the input to an optical power divider.

Multi-emitter laser 2 is capable of producing laser emission from an elongated aperture at multiple wavelengths within a narrow total spectral bandwidth. That is, the spectral output of multi-emitter laser 2 is temporally incoherent. "Temporally incoherent" means that the laser emits in multiple longitudinal modes. Such temporal incoherency can be achieved either by making each emitter a gain-guided laser or by sufficiently separating the optical beams of the emitters from each other so that the optical and evanescent waves of the output beam of each emitter are not coupled to those waves of the output beams of adjacent emitters. This may be achieved by physical separation, real refractive index waveguides, or by absorbing regions. However, the physical separation between the emitters must not be so great as to prevent the spatially separated light beams from being coupled into a multimode fiber of conventional diameter, as shown in FIG. 2. The fiber can be used in conjunction with a fused and tapered power divider, as shown in FIG. 3, or with a star coupler (not illustrated) such as a bi-conically tapered star coupler.

Figure 4:
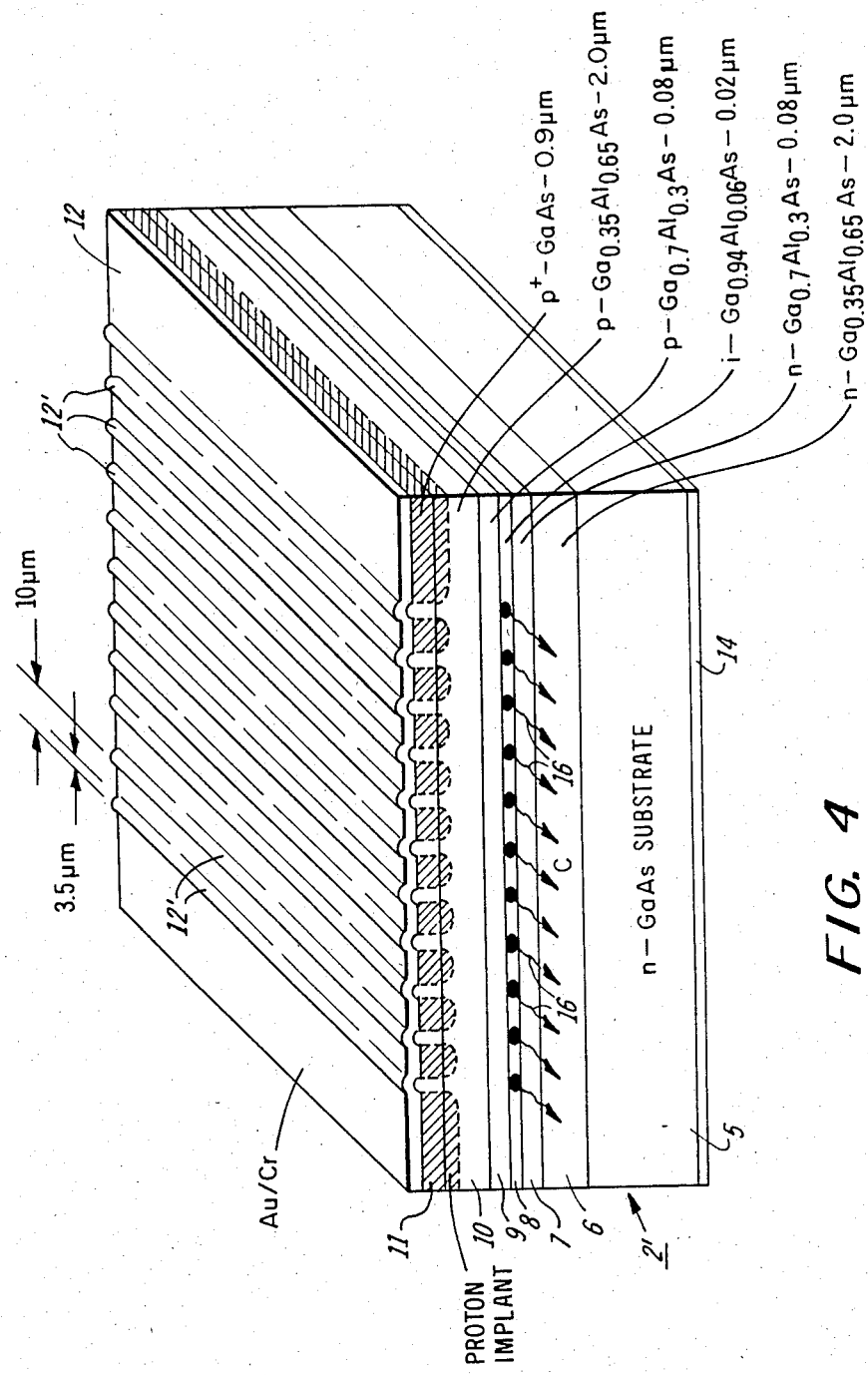

Exemplary of the multi-emitter laser 2 of FIGS. 1 and 2 is the single quantum well multi-heterostructure gain-guided laser 2' shown in FIG. 4. That laser consists of a GaAs substrate 5, an n-$Ga_{0.35}Al_{0.65}As$ cladding layer 6, an n-$Ga_{0.7}Al_{0.3}As$ cladding layer 7, an undoped quantum well active layer 8 of i-$Ga_{0.94}Al_{0.06}As$, a p-$Ga_{0.7}Al_{0.3}As$ cladding layer 9, a p-$Ga_{0.35}Al_{0.65}As$ cladding layer 10, and a $p^+$-GaAs cap layer 11. The layers 6–11 can have the exemplary thickness shown in FIG. 4. The various layers can be grown in a conventional manner such as in an atmospheric pressure vertical chamber MO-CVD system.

Multi-emitters for the laser 2' are provided by the p-side conducting contact geometry which, for example, features 11 parallel 3.5 micron wide stripes, on 10 micron centers, which extend the entire length of the laser. The p-side contact geometry is initiated by providing in a conventional manner photolithographic delineation of the pattern on a silicon nitride layer deposited on the layer 11. Next, proton implanation to a depth of approximately one micron serves to destroy the conductivity of the unmasked areas of layer 11 and adjacent areas of layer 10. After polishing the wafer, chrome/gold and gold/germanium contacts 12 and 14 are applied to the p and n sides, respectively, of the laser 2'.

Figure 4A:
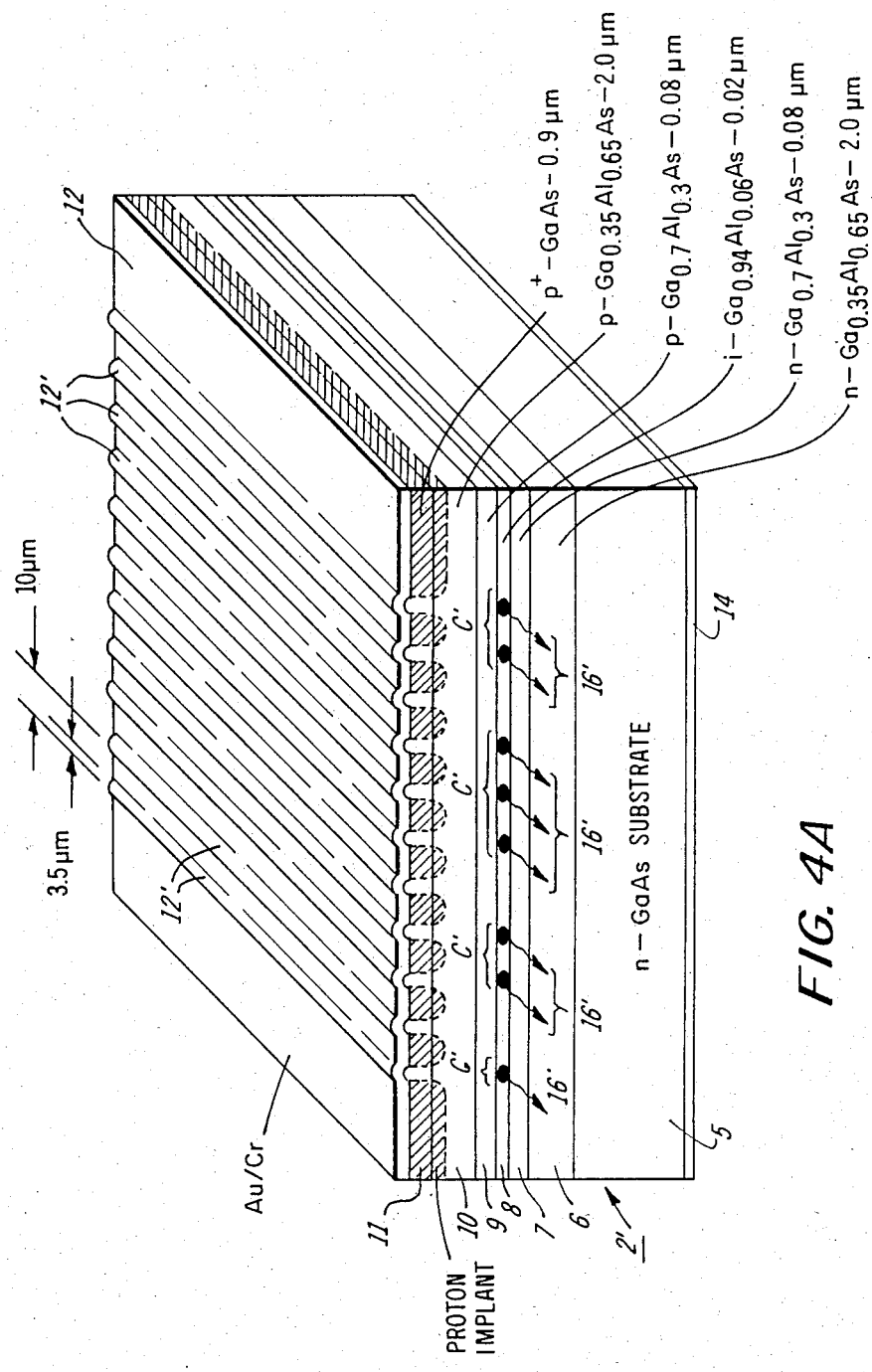
Figure 7:
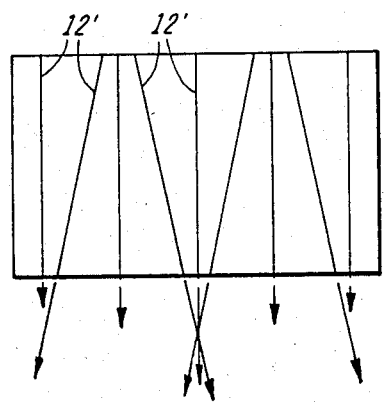
FIGS. 7–11 show different laser cavity geometries for providing an incoherent output beam effect.
Figure 14:
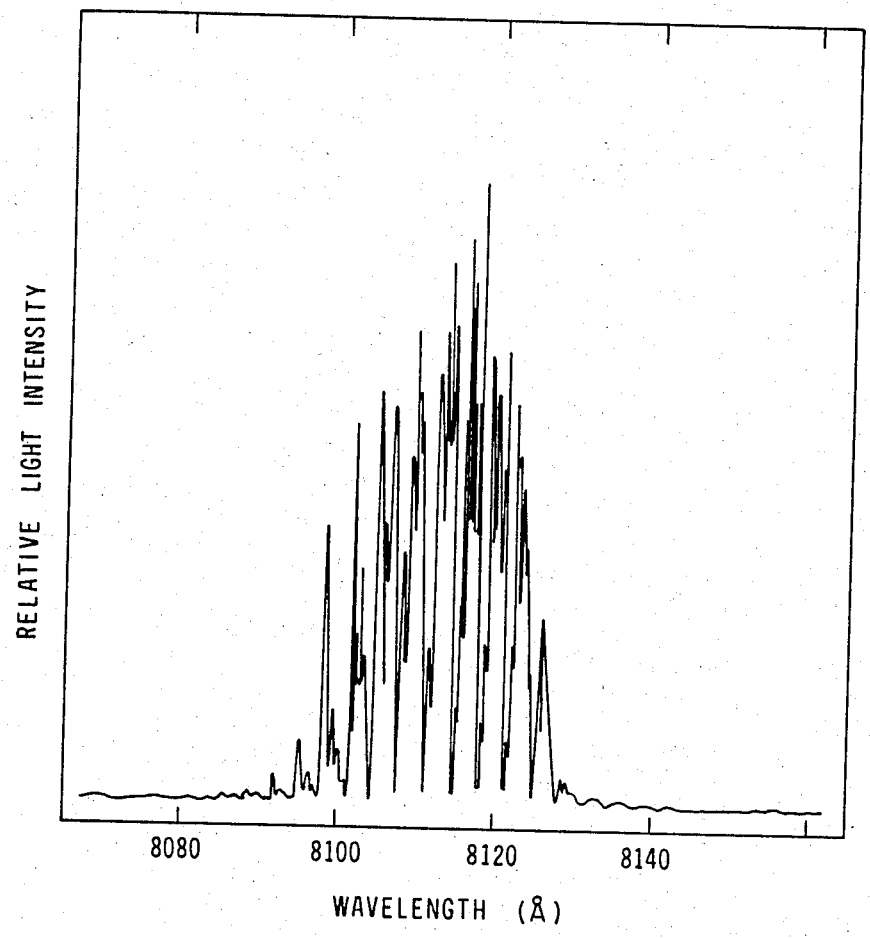

Due to the p-side contact geometry, multiple laser cavities lying beneath stripes 12' of electrode 12 are excited simultaneously when the laser 2' is conventionally dc biased and modulated by a pulsed or continuous wave signal supplied to electrode 12. In FIG. 4, a separate output beam 16 is depicted as being emitted from each laser cavity, it being assumed that all of the cavities emit or lase, and that the 10 micron separation between lasers may allow wave coupling between emitters. If such coupling occurs, the spaced emitting regions will be spatially coherent or "phase-locked". If, however, the lateral waveguiding mechanism is due to gain-guiding, as in laser 2', the laser emissions have curved wavefronts leading to multiple longitudinal mode operation. Such emissions have a low degree of temporal coherence and modal noise is not observed. Uniform filling of the spatial modes of the fiber is obtained due to the extended source geometry. If, however, the spaced emitting regions are index-guided and are optically coupled to one another, both spatial and temporal coherence obtains and modal noise is observed. In some cases, it is believed that some of the laser cavities will not lase and that the emissions of some adjacent cavities will couple so that the output of laser 2' may be as shown in FIG. 4a, wherein three of the laser cavities are non-emitting and adjacent laser cavity emissions couple to provide, in effect, four laser cavities c' emitting four separate output beams 16'. Beams 16' do not couple because the laser cavities c' are now separated by at least a distance of 20 microns. Since the laser cavities are gain-guided, the laser emissions 16 or 16' have curved wavefronts along the plane of the p-n junction and thus are comprised of multiple longitudinal modes. Accordingly, due to laser 2' having multiple independent emissions, each comprised of multiple longitudinal modes, the laser 2' composite output beam is substantially incoherent. Specifically, the longitudinal mode spectrum of the composite output beam of the laser 2' of FIGS. 4 and 4a, when properly dc biased and cw modulated, would be approximately as shown in FIG. 14.

In order to further minimize radiation and evanescent wave coupling between the emissions of the multiple laser cavities of laser 2, the laser 2'' of FIG. 5 can be utilized. Laser 2'' is similar to laser 2' except that the outer cladding layers are not present and the substrate has multiple grooves or channels 20 corresponding in number and alignment with the p-side contacts. A uniformly pumped wide contact not consisting of individual conducting regions over the channels can also be used when the channels provide lateral waveguiding. The channeled substrate structure inserts optically absorbing material (GaAs) between the laser cavities, thereby attenuating the extremities of the evanescent waves of the output beams and, accordingly, preventing coupling of such waves. Both lasers 2' and 2'' can utilize a multi-layer quantum well active layer of the type shown in FIG. 6. In addition, the channels cause real refractive index waveguiding which limits the optical field coupling of adjacent emitters.

In the multi-emitter layers of FIGS. 4 and 5, the laser cavities are approximately the same length, with emissions of different cavities being at different frequencies due to small variations or anomalies in the composition, shape or size of the various layers or regions of the laser. For example, different laser cavities may have different charge densities, there may be a slight difference in the active layer thickness between laser cavities, or the proton implantation (or other current confining means) may make the p-side contact geometry slightly different in length (optical path length) between some cavities, all resulting in the different cavities emitting at different frequencies.

Figure 8:
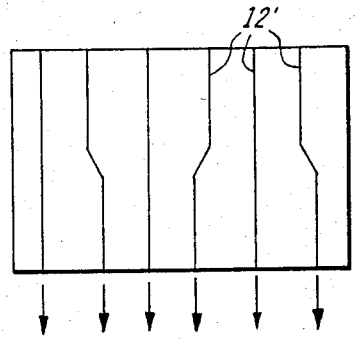
Figure 9:
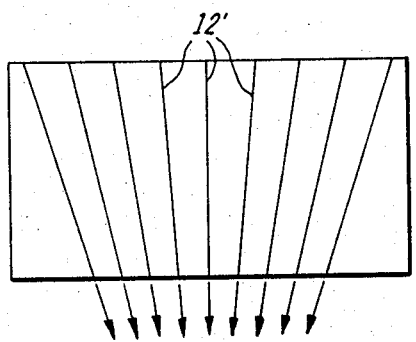
Figure 10:
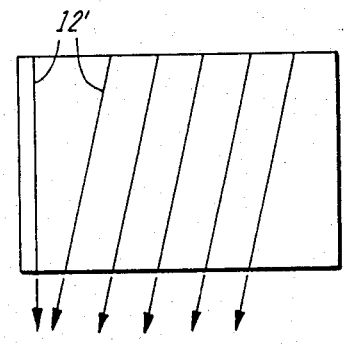
Figure 11:
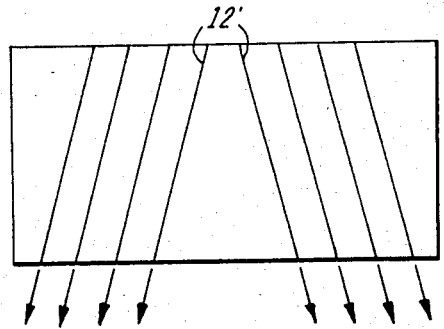

To further ensure that the multiple emissions will be at different frequencies, that is, closely spaced temporally incoherent emissions, the thickness of the active region layer 8 can be varied (tapered). Still another way of achieving emissions at different frequencies is to form individual lasers with strong lateral index waveguides, such as closely spaced (20 micron or less) buried heterostructure lasers, CSP lasers, TJS lasers, or mesa lasers. Also, with no lateral guiding mechanism, a difference in cavity length between laser cavities in the array, such as by having the p-side contact geometry have other than all parallel contacts 12', as shown in FIGS. 7, 9, 10 and 11, or non-linear contacts 12', as shown in FIG. 8, could also produce the desired temporally and spatially incoherent output beam effect. Also, operating the multiple stripe lasers at high current levels provides the desired lateral (spatial) incoherence effect due to self-focusing effects.

Figure 12:
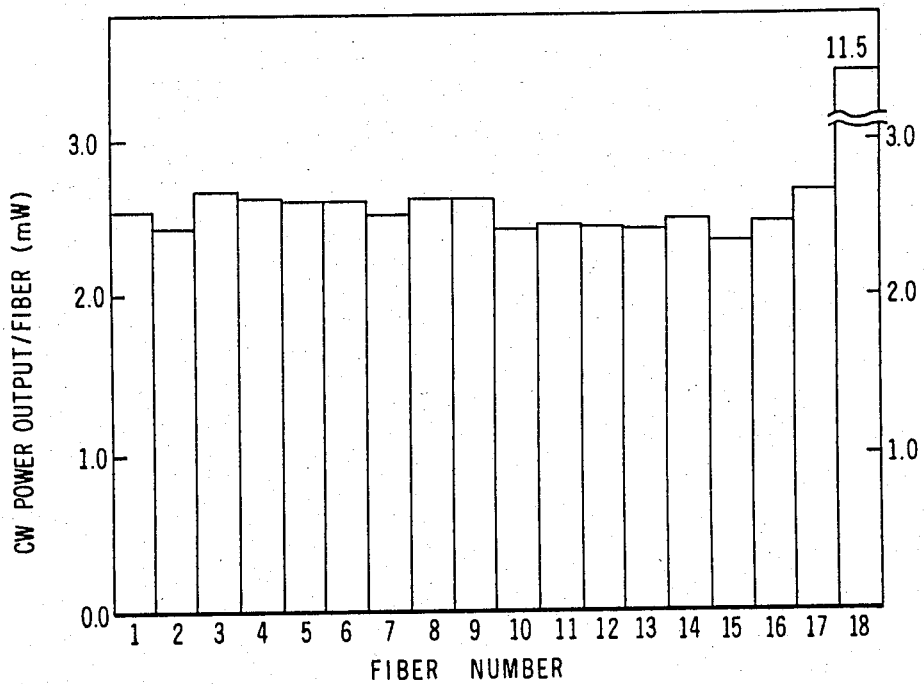
FIG. 12 shows the power output of the ports of an 18 port star coupler.
Figure 13:
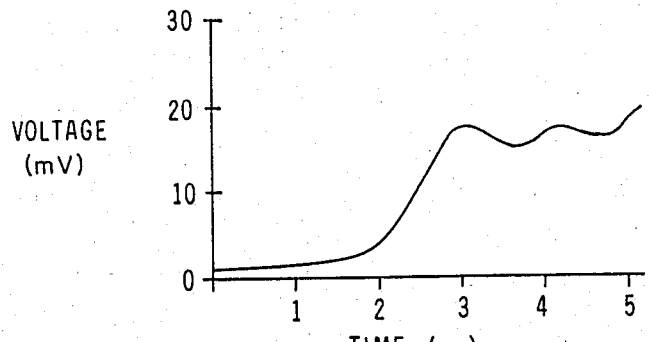

In a test of the operation of the laser 2', it was DC biased to just below threshold (122 milliamps) and butt coupled to an 18 port bi-conically tapered star coupler with 500 meter long output channels. The power output of each fiber is shown in FIG. 12. As shown, it is very uniform due to the extended nature of the laser source. The laser was modulated by 50 nanosecond wide 1 nsec rise time data packet pulses with a pulse amplitude as great as 100 mA and a duty cycle of ∼50%. The pulsed response of the laser which was observed with an avalanche photodetector is shown in FIG. 13. As shown, the rise time of the laser 2' is ∼1 nsec. The rise time is limited by the electronics rather than the laser with relaxation oscillations fully damped in 1 nsec. The ripple in the optical pulse after turn-on is due to electrical reflections in the pulse excitation circuit rather than relaxation oscillations. Thus, because the multiple emitting cavities of laser 2' operate fairly independently, it is believed that the overall effect of relaxation oscillations which are observed in single emitter laser diodes are reduced. When the optical pulses from laser 2' are detected at the receiver, they exhibit a minimum detectable noise level identical to that of a Hitachi HLP-50 LED. (In order to test this minimum detectable noise level at the receiver, the excited fiber output must first be attenuated.) In contrast, the minimum detectable noise level observed for a conventional laser such as the Hitachi CSP laser can be significantly higher (∼6 dB) and is especially dependent on launch conditions, owing to the small source size which does not allow uniform excitation of the fiber modes and the high degree of temporal coherence. The laser 2' shows no such dependence of noise on alignment. CSP laser can be significantly higher (∼6 dB) and is especially dependent on launch conditions, owing to the small source size which does not allow uniform excitation of the fiber modes and the high degree of temporal coherence. The laser 2' shows no such dependence of noise on alignment.

This similarity in behavior of laser 2' to an LED rather than a conventional single mode laser is due in part to the broad spectral distribution emitted from the multiple lasing cavities of the laser 2'. Such a longitudinal mode spectrum is shown in FIG. 14, where the laser 2' is operating at a power level of 100 mW CW/facet. As shown, the FWHP is ∼20 Angstroms and multiple mode sets with many satellites are observed, indicating a lack of coherence between the spatially separated emitters. Thus, this lack of spatial and temporal coherence apparently acts to cancel noise effects, leading to freedom from both modal noise and optical feedback effects. However, even if laser 2' is spatially coherent but temporally incoherent, noise effects will be similarly reduced.

It should be noted that this invention is described by examples of using GaAlAs laser material. Any other semiconductor laser material emitting multiple longitudinal modes (being temporally incoherent) and emitting from an extended source area would produce similar results. In addition, the particular GaAlAs heterostructure and current confining geometries are for example only. Other heterostructure and laser diode current confinement geometries can be equally applied.

Accordingly, the invention is intended to embrace all such alternatives, modifications, and variations as fall within the spirit and scope of the appended claims.

What is claimed is:

1. An optical arrangement including a multimode optical fiber having a core, and multi-emitter light source means for emitting from an emitting region a spatially extended light beam comprised of a plurality of light beams at multiple wavelengths within a narrow total spectral bandwidth, said light emitting region and an end of said core being adjacently disposed, such disposition of said emitting region and said end of said core and the spatial extent and multiple wavelengths of said light beam providing for substantially uniform excitation of all the modes of said optical fiber thereby substantially reducing the noise level and providing uniformity of the light signal detected at an output of said optical fiber.

2. An optical arrangement including a multimode optical fiber having a core, and solid state multi-emitter light source means for emitting from an emitting region a spatially extended light beam having a width approximately matching the core diameter of said core and comprised of a plurality of light beams at multiple wavelengths within a narrow total spectral bandwidth, said light emitting region and an end of said core being adjacently disposed, such deposition of said emitting region and said end of said core and the spatial extent and multiple wavelengths of said light beam providing for substantially uniform excitation of all the modes of said optical fiber thereby substantially reducing the noise level and providing uniformity of the light signal detected at an output of said optical fiber.

* * * * *